(12) United States Patent
Paik et al.

(10) Patent No.: US 6,362,090 B1
(45) Date of Patent: Mar. 26, 2002

(54) METHOD FOR FORMING FLIP CHIP BUMP AND UBM FOR HIGH SPEED COPPER INTERCONNECT CHIP USING ELECTROLESS PLATING METHOD

(75) Inventors: Kyung Wook Paik; Jae Woong Nah; Young Doo Jeon; Myung Jin Yim, all of Taejon (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 0 days.

(21) Appl. No.: 09/704,675

(22) Filed: Nov. 3, 2000

(30) Foreign Application Priority Data

Nov. 6, 1999 (KR) ............................................. 99-49093

(51) Int. Cl.⁷ ............................................... H01L 21/44
(52) U.S. Cl. ........................ 438/614; 257/737; 257/738; 257/748; 257/772; 257/778; 257/781; 438/612; 438/613; 438/614
(58) Field of Search ................................. 257/737, 738, 257/748, 772, 778–781; 438/612–614

(56) References Cited

U.S. PATENT DOCUMENTS

| | | | |
|---|---|---|---|
| 5,466,635 A | 11/1995 | Lynch et al. ................. | 437/183 |
| 5,759,910 A | 6/1998 | Mangold et al. ............ | 438/613 |
| 5,789,142 A * | 8/1998 | Brown ......................... | 430/315 |
| 5,792,594 A * | 8/1998 | Brown et al. ................ | 430/315 |
| 6,175,161 B1 * | 1/2001 | Goetz et al. ................. | 257/780 |

FOREIGN PATENT DOCUMENTS

JP           62304221       *    6/1989

OTHER PUBLICATIONS

Pai et., "Copper as the Future Interconnect Material", Proceeding of the VMIC Conference, p 258, Jun., 1989.*
Aintila et al., "Towards Low cost High Density Bumping", Proceedings of the Intl. Electronics manufacturing Technology Symposium, p 33, 1993.*
Aschenbrenner et al., "Electroless Nickel/Copper plating as a New Bump Metallization", Proceedings of MCM Conference, p 390, 1994.*
Aschenbrenner et al., "Electroless Nickel/Copper plating as a New Bump Metallization", IEEE transactions on Components, Packaging and manufacturing technology—Part B, vol 18(2), p 334, 1995.*
Anhock et al., "Reliability of Electroless Nickel for High Temperature Applications", Proceedings of the 1999 International Symposium on Advanced packaging Materials, p 256, Mar. 1999.*

* cited by examiner

Primary Examiner—Charles Bowers
Assistant Examiner—Asok Kumar Sarkar
(74) Attorney, Agent, or Firm—Foley & Lardner

(57) ABSTRACT

A method for forming flip chip bumps or UBM for a high speed copper interconnect chip, and more particularly to a method for forming a flip chip bump or UBM of copper/nickel, copper/nickel/copper or etc. which are carried out by a subsequent process of electroless copper plating and electroless nickel plating on a copper I/O pad. According to the method, both of electroless copper and nickel plating methods are used for forming electroless copper/nickel bumps of a copper interconnect chip so that advantages of the electroless copper plating, i.e. excellent selectivity and adhering strength to the copper chip pad and an advantage of the electroless nickel plating, i.e. excellent plating rate can be achieved at the same time.

4 Claims, 5 Drawing Sheets

METHOD FOR FORMING FLIP CHIP BUMP AND UBM FOR HIGH SPEED COPPER INTERCONNECT CHIP USING ELECTROLESS PLATING METHOD

BACKGROUND OF THE INVENTION

1. Field of the Invention

The present invention generally relates to a method for forming flip chip bumps or UBM(under bump metallurgy) for a high speed copper interconnect chip, and more particularly to a method for forming flip chip bumps or UBMs of copper/nickel, copper/nickel/copper or etc., which are carried out by a subsequent process of electroless copper plating and electroless nickel plating on a copper I/O pad.

2. Description of the Related Art

In the rapidly changing electronics industry, as higher integrated and more complex semiconductor technology is continuously developing, endeavors for achieving a system having higher performance together with more miniaturized size are on the way. As the line width of a semiconductor device is gradually decreased, inner gate delay becomes smaller. However, RC delay caused by interconnections of the chips is gradually increasing.

At present, most metal wires employ $Al/SiO_2$ structure, in which the aluminum layer contains copper of 0.5 wt % and formed by sputtering method. Aluminum has low resistivity and good adhesiveness to $SiO_2$ and silicon, so it is most used for interconnection material of a silicon-based integrated circuit. However, aluminum has drawbacks that deposition of a dielectric thin film should be carried out at about 400 to 450° C., since aluminum has low melting point of 660□ and also low eutectic temperature of 577° C. when mixed with silicon. Also, it has other problems such as electromigration, spiking, hillock, poor via hole filling, poor step coverage and etc. Therefore, in order to solve electromigration and spiking problems, a small amount of Cu, Ti, Si and etc. are introduced into the aluminum when depositing an aluminum layer. Also, in order to reduce contact resistance in gate, source and drain, silicide is used which is formed by which is formed by diffusing a metal component on $SiO_2$.

Tungsten is widely used as another interconnection material for a silicon-based integrated circuit with a line width at most 1 micron, and has a thermal expansion coefficient similar to that of silicon. Tungsten is being researched and used for filling a contact hole or a via hole due to its applicability to a high temperature process and excellent filling capability in a structure having a high aspect ratio, even though it has a drawback of high resistivity compared to aluminum.

However, such an improvement on Al/SiO2 structured metal wire process may have limitations in enhancing chip speed. Therefore, interconnection material with lower resistance is being more important, and thus a copper interconnect technique is gaining more interest since copper has resistivity of 1.67 $\mu\Omega$-cm lower than that of aluminum of 2.66 $\mu$-cm and excellent resistance to electromigration. When copper wire is used alone, efficiency in chip speed can be enhanced only in 50%. But, when a polymer material having a dielectric constant much lower than that of $SiO_2$ is used together, speed enhancement up to 400% can be expected. Therefore, when copper and a lower-premittivity insulating polymer are used, the number of metal layers in a chip can be reduced effectively.

However, in an actually used electronics system, high integration of a system is not obtained by micro- miniaturizing and highly integrating chips only. Chips require interconnection and effective packaging to supply current for stable operation and to effectively radiate heat. In use, total delay of a system results from both on-chip delay and off-chip package delay. In a very high speed system, at least 50% of total delay is off-chip package delay, and about 80% of total delay is expected to be packaging delay in 2000's considering current integration techniques. Therefore, in the package of a copper chip, a novel technique for copper chip interconnection is highly required to utilize advantages of copper interconnection in the maximum amount.

Current techniques for semiconductor chip interconnections include wire bonding, tape automated bonding(TAB) and flip chip technique. Among them, direct chip attach (DCA), chip size package(CSP) and multichip module (MCM) are being more important in necessity which utilize a high density interconnection flip chip technique. IBM developed the conventional flip chip technique to apply to the conventional aluminum pad formed on an inorganic substrate by using a high melting point solder, for example, 95% Pb–5% Sn during 1970s. At present, IBM, Motorola, Delco and Flip Chip Technology in the U.S.A. or Hitachi and Toshiba in Japan, and etc. are developing flip chip bumping techniques by using solder substance with low melting point to use organic substrates in low price.

However, the novel copper interconnect chip technique is in the initial stage of research and development in respect to the conventional aluminum interconnection. Also, presently research results for wire bonding or flip chip technique on a copper pad is not reported at all. These techniques will gain economic importance when the copper chip is generally used in the industry.

SUMMARY OF THE INVENTION

The present inventors, while studying a novel technique to substitute the conventional aluminum interconnection, found that copper/nickel bumps or UBMs which meet requirements of electronic devices can be formed by repeating electroless copper plating and electroless nickel plating which are relatively in low price in forming non-solder bumps or UBMs for enabling flip chip interconnection on a copper pad for high speed operation, thereby completing the present invention.

Therefore, it is an object of the present invention to provide a method for forming electroless copper/nickel bumps and UBMs of a copper interconnect which has excellent selectivity and adhering strength to a copper chip pad together with fast plating rate, and to adopt electroless plating in process stage, thereby by reducing process time and saving cost to enhance productivity.

According to the present invention, there is provided a method for forming flip chip bumps and under bump metallurgy for a high speed copper interconnect chip, the method comprising the steps of: (a) plating copper on a copper pad via electroless plating to form a copper plated layer; and (b) plating nickel on the copper plated layer via electroless plating to form a nickel plated layer.

BRIEF DESCRIPTION OF THE DRAWINGS

Hereinafter, a method for forming flip chip bump or UBM(under bump metallurgy) for high speed copper interconnect chip by using electroless copper/nickel plating of the present invention will be described in detail in the reference to the appended drawings, wherein.

DESCRIPTION OF THE PREFERRED EMBODIMENT

Figure 1:
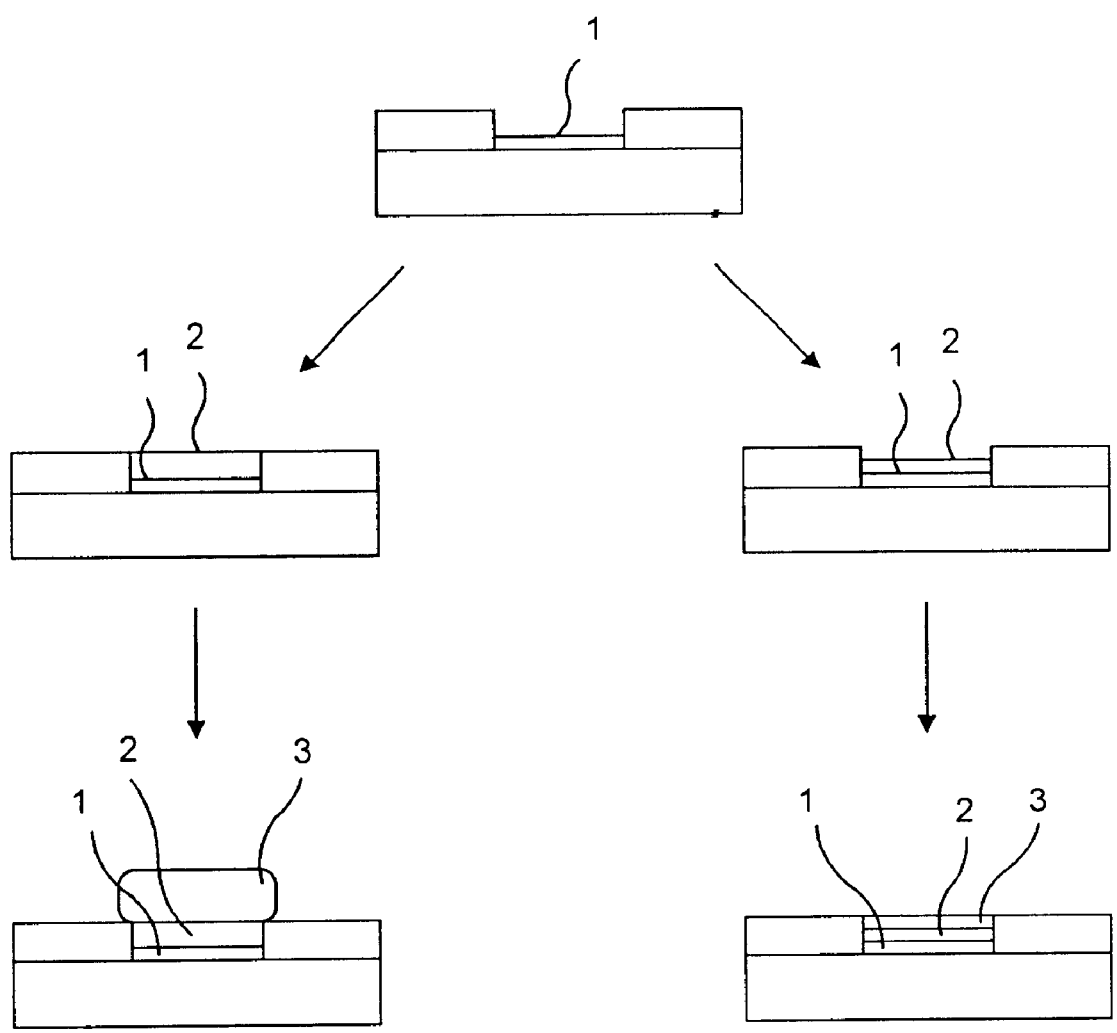
FIG. 1 is a schematic view for illustrating electroless copper/nickel plating on a copper pad of the present invention.

FIG. 1 is a schematic view for illustrating electroless copper/nickel plating on a copper pad of the present invention. Referring to FIG. 1, a copper pad 1 is formed on a wafer, and an electroless copper plating layer 2 is formed on the copper pad 1 for forming bumps and UBM. The copper layer 2 is formed by using electroless plating and thus does not require thin film deposition and lithography processes.

A plating solution in use for forming the electroless copper plating layer 2 can have a composition of about 1 to 4 g/l copper, about 5 to 18 g/l sodium hydroxide and about 4 to 12 g/l formaldehyde, and more preferably about 2 to 3 g/l copper, about 8 to 10 g/l sodium hydroxide and about 6 to 8 g/l formaldehyde. Hereinabove, when composition ratio of the plating solution is varied, reduction of copper is difficult thereby obstructing normal formation of a copper layer. When content of each component is lower than the aforementioned range, the plating rate is too slow to be economically used. On the contrary, when content of each component is higher than the aforementioned range, the plating rate is too fast so that an insulating layer is also plated thereby obstructing selective plating on the copper pad.

The electroless copper plating is carried out by reducing copper according to the following reaction in which formaldehyde is used as a reducer:

$$Cu^{2+} + 2HCHO + 4OH^- \rightarrow Cu + 2H_2O + 2HCO_2^-$$

In the aforementioned electroless copper plating, the surface of the copper pad 1 on a copper interconnect chip serves as nucleus. So, the copper pad 1 can be selectively plated even without pre-treatment. Also, uniform maximum plate thickness of about 5 microns for bumps and about 1 microns for UBMs can be obtained, respectively.

Then, an electroless nickel plating layer 3 is formed on the electroless copper plating layer 2 formed on the copper pad 1.

A plating solution in use for forming the electroless nickel plating layer 3 can have a composition of 5 to 10 g/l nickel and about 20 to 45 g/l sodium hypophosphite, and preferably about 5 to 7 g/l nickel and about 25 to 35 g/l sodium hypophosphite. In the electroless nickel plating using sodium hypophosphite, process can be divided into the following main and second processes;

main process:

$$Ni^{+2} + H_2PO_2^- + H_2O \rightarrow Ni + H_2PO_3^- + 2H^+ \quad (I)$$

$$H_2PO_2^- + H_2O \rightarrow H_2PO_3^- + H_2 \quad (II)$$

second process:

$$2H^+ + 2e^- \rightarrow H_2 \quad (III)$$

$$H_2PO_2^- + H^+ \rightarrow P + OH^- + H_2O \quad (IV).$$

In the aforementioned equations, reduction of nickel is carried out according to the equation (I), consumption of sodium hypophosphite is carried out according to the equation (II), production of hydrogen is carried out according to the equation (III) and production of phosphorus is carried out according to the equation (IV).

In the aforementioned electroless nickel plating, the electroless plated copper can serve as nucleus. So, copper/nickel bumps or UBMs can be formed without additional pre-treatment, in which nickel bumps may be formed a uniform thickness of about 15 microns and UBMs may be formed a thickness of a few microns.

Among various electroless platings, the electroless copper plating has an advantage of excellent selectivity and adhesive strength on the copper pad, but has a disadvantage of slow plating rate. The electroless nickel plating has relatively fast plating rate, but has disadvantages that direct formation on the copper pad is difficult and the resulting layer can be severely stressed since phosphorus is contained in a large amount according to reduction reaction in plating. However, the electrolessly plated copper contains almost no impurities to have smaller stress than the nickel layer thereby reducing bumps or UBMs from being detached from the pad due to stress and enabling direct electroless nickel plating on the electroless plated copper. So, copper/nickel bumps or UBMs can be formed on a copper pad of a copper interconnect chip by using these two types of electroless plating methods. Also, multi-layer copper/nickel bumps can be formed to have bump features corresponding to specific requirements by repeating the copper/nickel electroless platings at least two times, and can be used as a UBM layer of a solder bump by electrolessly plating copper/nickel in a small thickness.

The aforementioned electroless copper/nickel plating method can be referred as a novel method for forming a non-solder flip chip bump or UBM, in which the advantage of copper connection is maximized in a flip chip package of a copper interconnect chip which can transmit electrical signal faster than aluminum interconnect chip. Also, this technique exhibits a process integrity since electroless plating method is used for obtaining both of copper and nickel plates, and cost of process is advantageously low.

Figure 2A:
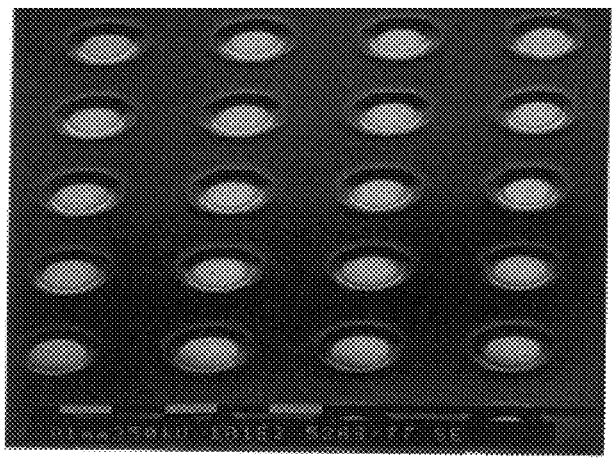
FIGS. 2A to 2C are photographs of forming bumps by using electroless copper/nickel plating on the copper pad of the present invention.
Figure 2B:
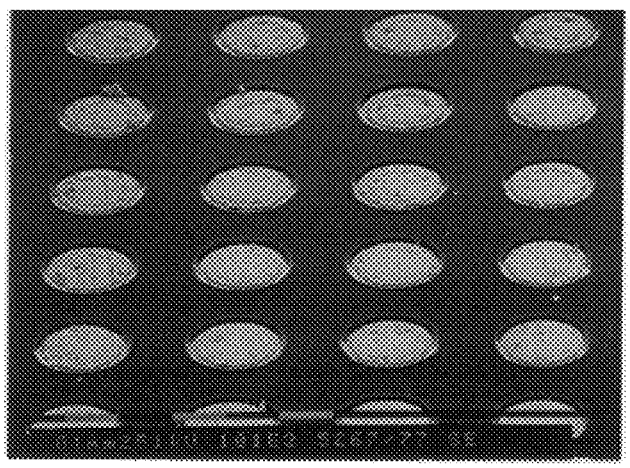
Figure 2C:
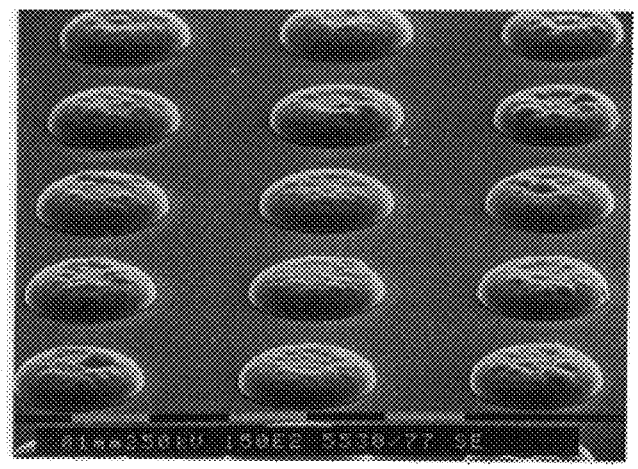

FIGS. 2A to 2C are photographs of forming bumps by using electroless copper/nickel plating on the copper pad of the present invention. FIGS. 2A to 2C also show a process of forming a copper pad with a diameter of 100 microns (FIG. 2A), forming an electroless copper plated layer on the copper pad (FIG. 2B), and forming an electroless nickel plated layer on the copper pad (FIG. 2C) in sequence. A plating solution for the electroless copper plated layer has a composition about 2 g/l copper, 9 g/l sodium hydroxide and 7 g/l formaldehyde. The plating temperature is maintained at 50° C. for 2 hours in a constant temperature bath. Also, bubbles are introduced into the plating solution by using nitrogen gas, and the pressure in the constant temperature bath is higher than the atmosphere due to gas bubbles. The copper plated layer obtained from the process has a thickness of about 5.2 microns.

A plating solution for the electroless nickel plated layer has a composition of about 6 g/l nickel, about 30 g/l sodium hypophosphite. The plating temperature is maintained at 90° C. for 45 minutes in a constant temperature bath. Similarly to the electroless copper plated layer, bubbles are introduced into the plating solution by using nitrogen gas to obtain a uniformly plated layer. In this case, the obtained nickel plated layer has a thickness of about 15 microns.

As described above, the method of the present invention enables a bump to be selectively formed on a copper pad. In addition, the formed bumps have uniform heights, and thus can be advantageously applied in connecting conductive polymer flip chips.

Figure 3A:
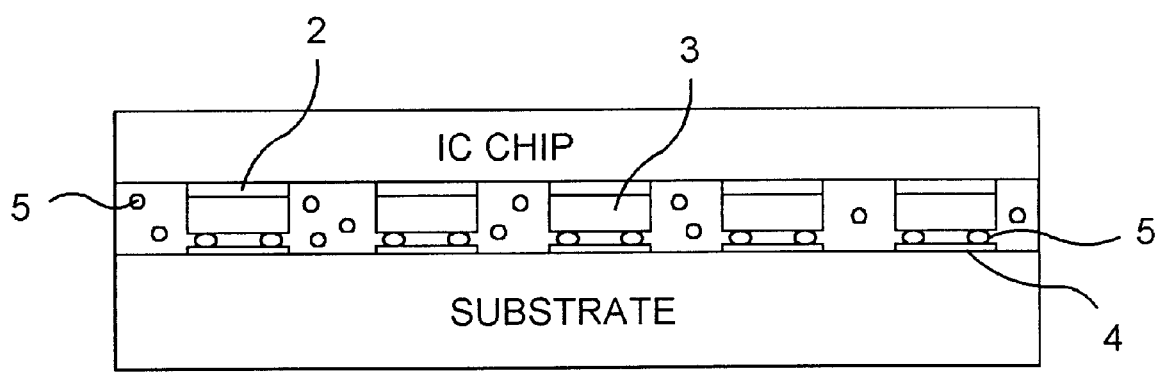
FIG. 3A is a sectional view for showing a connection state of flip chips by using conductive polymers and electroless copper/nickel bumps formed on the copper pad.
Figure 3B:
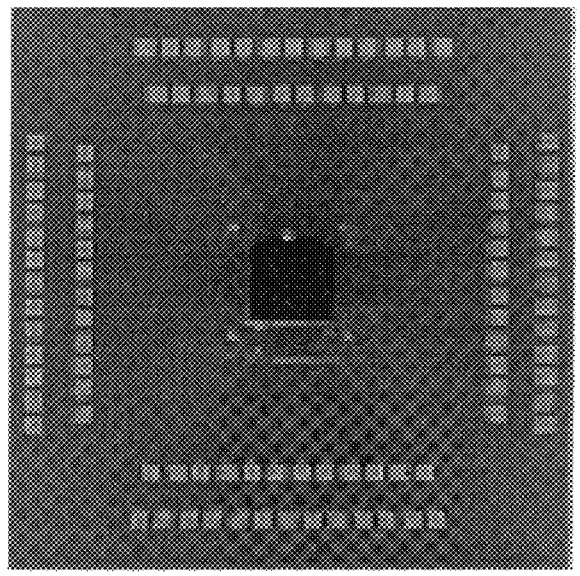
FIG. 3B is a photograph for showing an overall ACF (Anisotropic Conductive Film) flip chip connection.

FIGS. 3A and 3B are for showing flip chip connection steps of electroless copper/nickel bumps formed on a copper pad by using a conductive polymer. FIG. 3A is a sectional view for showing a copper interconnect chip and a substrate, in which an anisotropic conductive adhesive(ACA) is used when carrying out a flip chip connection of the copper interconnect chip having electroless copper/nickel bumps formed thereon onto the substrate. The substrate pad and the chip with bumps are connected by flipping and connecting the chip with the pad 4 of the substrate by ACA. The ACA includes conductive particles 5 which electrically connect between the electroless plated copper/nickel bumps and the substrate pad 4. In turn, FIG. 3B is a picture for showing an overall ACF(Anisotropic Conductive Film) flip chip connection.

Figure 4B:
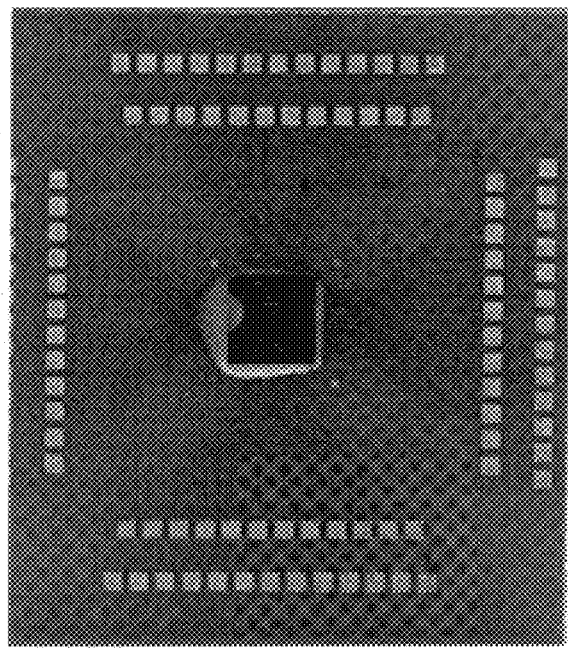
FIG. 4B is a photograph for showing an overall solder flip chip connection.
Figure 4A:
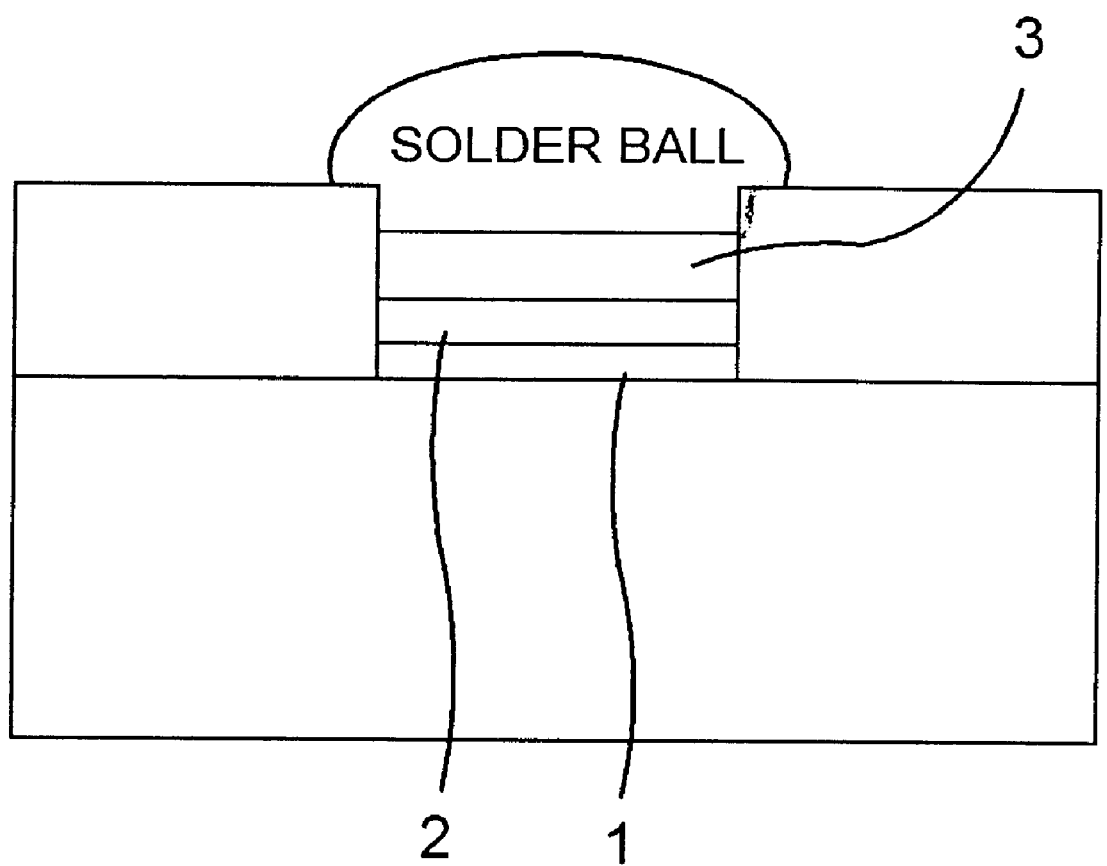
FIG. 4A is a sectional view for showing a solder ball settled on the electroless copper/nickel UBMs formed on the copper pad.

FIG. 4A is a sectional view for showing a solder ball settled on the electroless copper/nickel UBMs formed on the copper pad. The chip with a solder ball is connected with the pad 4 of the substrate (shown in FIG. 3A) by reflow after being flipped for alignment. FIG. 4B is a photograph for showing an overall solder flip chip using electroless Cu/Ni UBMs interconnection on a PCB substrate.

According to the method for forming flip chip bumps or UBMs for a high speed copper interconnect chip of the present invention, both of electroless copper and nickel plating methods are used for forming electroless copper/nickel bumps of a copper interconnect chip so that advantages of the electroless copper plating, i.e. excellent selectivity and adhering strength to the copper chip pad and an advantage of the electroless nickel plating, i.e. excellent plating rate can be achieved at the same time. Also, bumps which can meet specific requirements can be fabricated by repeating the electroless copper and nickel plating methods at least two times.

Furthermore, according to the electroless plating method of the present invention, bumps can be selectively formed without a lithography process and in the unit of wafer so that process time can be reduced and cost can be saved. So, the electroless plating method of the present invention is expected to be widely adopted in the packaging techniques of the electronics industry.

What is claimed is:

1. A method for forming flip chip bumps or under bump metallurgy for a high speed copper interconnect chip, said method comprising the steps of:

(a) plating copper on a copper pad via electroless plating to form a copper plated layer; and (b) plating nickel on said copper plated layer via electroless plating to form a nickel plated layer.

2. The method of claim 1, further comprising repeating at least one said (a) and (b) steps of plating copper and nickel plates on said copper and nickel plated layers to form a copper and nickel plated multi-layer.

3. The method of claim 1, in said (a) step of plating copper, a plating solution is used which contains copper of 1 to 4 g/l, sodium hydroxide of 5 to 18 g/l and formaldehyde of 4 to 12 g/l.

4. The method of claim 1, in said (b) step of plating nickel, a plating solution is used which contains nickel of 5 to 10 g/l and sodium hypophosphite of 20 to 45 g/l.

* * * * *